(12) United States Patent
Takewaki et al.

(10) Patent No.: US 7,821,101 B2
(45) Date of Patent: Oct. 26, 2010

(54) SEMICONDUCTOR DEVICE INCLUDING CAPACITOR INCLUDING UPPER ELECTRODE COVERED WITH HIGH DENSITY INSULATION FILM AND PRODUCTION METHOD THEREOF

(75) Inventors: Toshiyuki Takewaki, Kanagawa (JP); Daisuke Oshida, Kanagawa (JP); Takuji Onuma, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 50 days.

(21) Appl. No.: 12/081,194

(22) Filed: Apr. 11, 2008

(65) Prior Publication Data
US 2008/0277762 A1 Nov. 13, 2008

(30) Foreign Application Priority Data
May 9, 2007 (JP) ............................. 2007-124278

(51) Int. Cl.
*H01L 29/92* (2006.01)
(52) U.S. Cl. ................. 257/532; 257/535; 257/E29.343
(58) Field of Classification Search ................. 257/532, 257/535, E29.343, 310, E27.048
See application file for complete search history.

(56) References Cited

U.S. PATENT DOCUMENTS

| 6,166,424 A * | 12/2000 | Mikawa et al. ............... 257/535 |
| 6,881,999 B2 * | 4/2005 | Lee et al. ..................... 257/306 |
| 2004/0043517 A1 * | 3/2004 | Sashida ......................... 438/3 |

FOREIGN PATENT DOCUMENTS

| JP | 2003-258108 | 9/2003 |
| JP | 2003-318269 | 11/2003 |
| JP | 2005-159290 | 6/2005 |

* cited by examiner

*Primary Examiner*—Victor A Mandala
*Assistant Examiner*—Scott Stowe
(74) *Attorney, Agent, or Firm*—McGinn IP Law Group, PLLC

(57) ABSTRACT

A semiconductor device includes a lower electrode provided on a semiconductor substrate, an upper electrode provided on the lower electrode to overlap a part of the lower electrode, a first insulating film provided between the lower electrode and the upper electrode, and a second insulating film provided in contact with an upper part of the upper electrode and on the upper part of the lower electrode, and having a density higher than that of the first insulating film, the second insulating film covering a side surface and a top surface of the upper electrode.

14 Claims, 10 Drawing Sheets

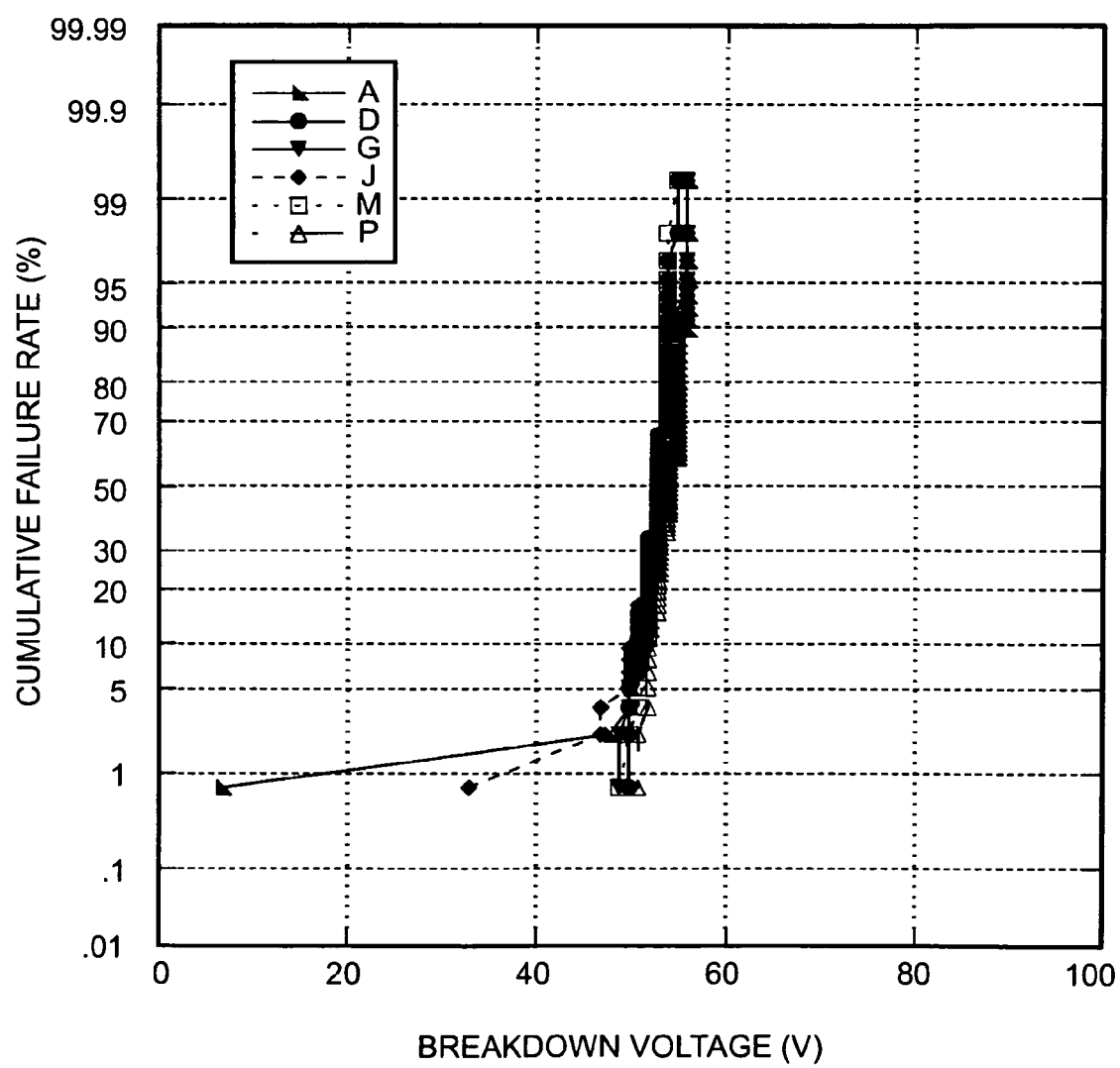

SEMICONDUCTOR DEVICE INCLUDING CAPACITOR INCLUDING UPPER ELECTRODE COVERED WITH HIGH DENSITY INSULATION FILM AND PRODUCTION METHOD THEREOF

BACKGROUND OF THE INVENTION

1. Field of the Invention

The present invention relates to a semiconductor device and a production method thereof, and more specifically, to a semiconductor device equipped with a capacitative element and a production method thereof.

2. Description of Related Art

As technologies related to semiconductor devices each equipped with a capacitative element of an MIM (Metal Insulator Metal) structure, there are those described by Patent document 1 to Patent document 3.

Patent document 1 describes a capacitative element formed on a semiconductor substrate directly or through a buffer layer. According to the document, it is assumed that by setting an area of an upper electrode smaller than an area of a lower electrode, leak and dielectric breakdown caused by thinning of the insulating film near a step part of the lower electrode can be suppressed. Moreover, as the insulating film that functions as a gate insulating film and as a capacitance film, a $SiO_2$ film is exemplified, and as the insulating film on the upper electrode of the capacitative element, a $SiO_2$ film and a $SiN_x$ film are exemplified.

Moreover, Patent document 2 describes a technology of forming a sidewall made up of a SiN film on a sidewall of the upper electrode of the capacitative element. It is assumed that by this technology, occurrence of side etching and etching damage of the dielectric film (capacitance film) right under an edge of the upper electrode can be prevented. Moreover, in terms of making it easy to set up the etching conditions, it is considered that preferably the side wall and the capacitance film are an identical insulating film.

Moreover, Patent document 3 describes a technology of providing a leak guard that is made up of an insulating material, such as plasma TEOS, so that it may cover an upper area and an edge area of the upper-layer electrode (the upper electrode) of the capacitative element. According to the document, it is assumed that by providing such a leak guard between the upper electrode and a reflection reducing film, the upper electrode and the reflection reducing film do not come in direct contact with each other, and therefore occurrence of leak current between the upper electrode and the lower-layer electrode layer (the lower electrode) can be prevented completely.

[Patent Document 1] Japanese Patent Laid Open Application No. 2005-159290

[Patent Document 2] Japanese Patent Laid Open Application No. 2003-258108

[Patent Document 3] Japanese Patent Laid Open Application No. 2003-318269

However, the present inventors have examined the above-mentioned conventional MIM capacity and have found that there is still a room of improvement on a side of suppressing a decrease in a withstand voltage.

Based on this finding, the present inventors have examined a cause of the decrease in the withstand voltage. FIG. 4 is a sectional view showing a configuration of a semiconductor device equipped with a capacitative element. In the semiconductor device shown in FIG. 4, a cap film 205, an interlayer insulating film 207, a cap film 213, an interlayer insulating film 215, an interlayer insulating film 217, a cap film 233, and an interlayer insulating film 235 are laminated on an upper part of the silicon substrate (unillustrated) sequentially from the bottom in this order. A lower electric wiring 211 and a lower electric wiring 209 are buried in the interlayer insulating film 207 and the cap layer 205, and an upper electric wiring 237 is buried in the interlayer insulating film 235 and the cap film 233.

Moreover, the capacitative element contacts the upper part of the interlayer insulating film 215, and is buried in the interlayer insulating film 217. The capacitative element is constructed with a lower electrode 219, an upper electrode 223, and a capacitance film 221 provided therebetween. The lower electrode 219 and the upper electric wiring 237 are being connected by a connecting plug 229, and the upper electrode 223 and the upper electric wiring 237 are being connected by a connecting plug 227. In order to connect the upper electrode 223 and the lower electrode 219 to the upper electric wiring 237, respectively, the upper electrode 223 has a structure where it overlaps a part of a formation area of the lower electrode 219. Moreover, the lower electric wiring 211 and the upper electric wiring 237 are being connected by a connecting plug 231.

In the manufacturing process of the semiconductor device shown in FIG. 4, after forming the conducting film that becomes the conducting film 219, the insulating film that becomes the capacitance film 221, and the conducting film that becomes the upper electrode 223 sequentially, the conducting film that becomes the upper electrode 223 is selectively removed by etching.

However, in the formation process of the upper electrode 223, as shown in FIG. 5, the inventors have found that there is a case where the insulating film that becomes the capacitance film 221 along the edge of the upper electrode 223 in the vicinity of the edge of the upper electrode 223 is overetched and a groove part 249 is formed. It is conjectured that by this mechanism, the periphery of the edge of the upper electrode 223 becomes a leakage path of the capacitance film and the withstand voltage decreases.

SUMMARY OF THE INVENTION

According to an exemplary aspect of the present invention, a production method of a semiconductor device includes:

forming a first conducting film, a first insulating film, and a second conducting film on the upper part of the semiconductor substrate in this order;

forming the upper electrode by selectively removing the second conducting film; forming a second insulating film that covers a top surface of the first insulating film and side surfaces and a top surface of the upper electrode all over from the top surface of the first insulating film to the top surface of the upper electrode on an element formation surface of the semiconductor substrate on which the upper electrode is formed; and processing the second insulating film into a predetermined form by selectively removing the second insulating film, the first insulating film, and the first conducting film sequentially and also forming a capacitance film and a lower electrode, and a film density of the second insulating film is higher than a film density of the first insulating film.

In the production method of the present invention, the top surface of the first insulating film and the side surfaces and the top surface of the upper electrode are covered with the second insulating film whose film density is higher than that of the capacitance film. With this structure, even in the case where a part of the first insulating film is selectively removed in the vicinity of an edge of the upper electrode at the time of formation of the upper electrode, the removed portion can be buried by the second insulating film whose film density is higher than that of the first insulating film to supplement the lost location, and therefore the withstand voltage of an MIM capacity is improved. Moreover, the upper electrode edge is a part where an electric field tends to concentrate. According to the present invention, since the insulating film whose film density is relatively high is formed in such a location where the electric field tends to concentrate, the withstand voltage is improved further.

Incidentally, as will be described later in exemplary embodiments, such an action effect cannot be obtained simply by forming the same film on the upper electrode.

In the production method of the present invention, in the process of forming the upper electrode, the following process may be adopted: the first conducting film is selectively removed by etching, so that the top surface of the first insulating film is exposed in an area where the first conducting film is removed, a groove part is formed by etching the first insulating film in the vicinity of the edge of the upper electrode, and the groove part is buried by the second insulating film in the process of forming the second insulating film.

Moreover, according to an exemplary aspect of the present invention, a semiconductor device includes:

the lower electrode provided on an upper part of a semiconductor substrate, the upper electrode that is provided on an upper part of the lower electrode and that is provided so as to overlap a part of the lower electrode;

the first insulating film provided between the lower electrode and the upper electrode; and the second insulating film that is provided in contact with an upper part of the upper electrode and that is selectively provided on the upper part of the lower electrode, having a higher film density than that of the first insulating film, and the second insulating film covers the side surfaces and the top surface of the upper electrode.

In the semiconductor device of the present invention, since the second insulating film whose film density is higher than that of the first insulating film is selectively provided on the upper part of the lower electrode, MIM capacity can be protected from a stress that is imposed when in the assembly. Moreover, an area of the upper part of the lower electrode can be covered with a film having a high film density and thereby can be reinforced. By this, it can be made to have a configuration still further excellent in reliability. Moreover, since by selectively providing the film having a high film density on the upper part of the lower electrode, the dielectric constants of the interlayer insulating film of other parts can be suppressed, the capacity between the electric wiring can be suppressed.

In the semiconductor device of the present invention, it may be configured that a groove part is provided in the first insulating film along the edge of the upper electrode and the second insulating film that covers the side surfaces and the top surface of the upper electrode is provided so as to bury the groove part. If the device is configured in this way, breakdown of the capacitance film in the vicinity of the edge of the upper electrode is further assuredly suppressed and the device can have the configuration still further excellent in the withstand voltage.

Incidentally, an arbitrary combination of these configurations and an expression of the present invention that is converted between methods, devices, etc. are also effective as an embodiment of the present invention.

As explained above, according to the present invention, the withstand voltage of the capacitative element of an MIM structure can be improved.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 8 is a figure showing the evaluation result of the withstand voltage of the capacitative element in the embodiment.

DETAILED DESCRIPTION OF THE EXEMPLARY EMBODIMENTS

Figure 1:
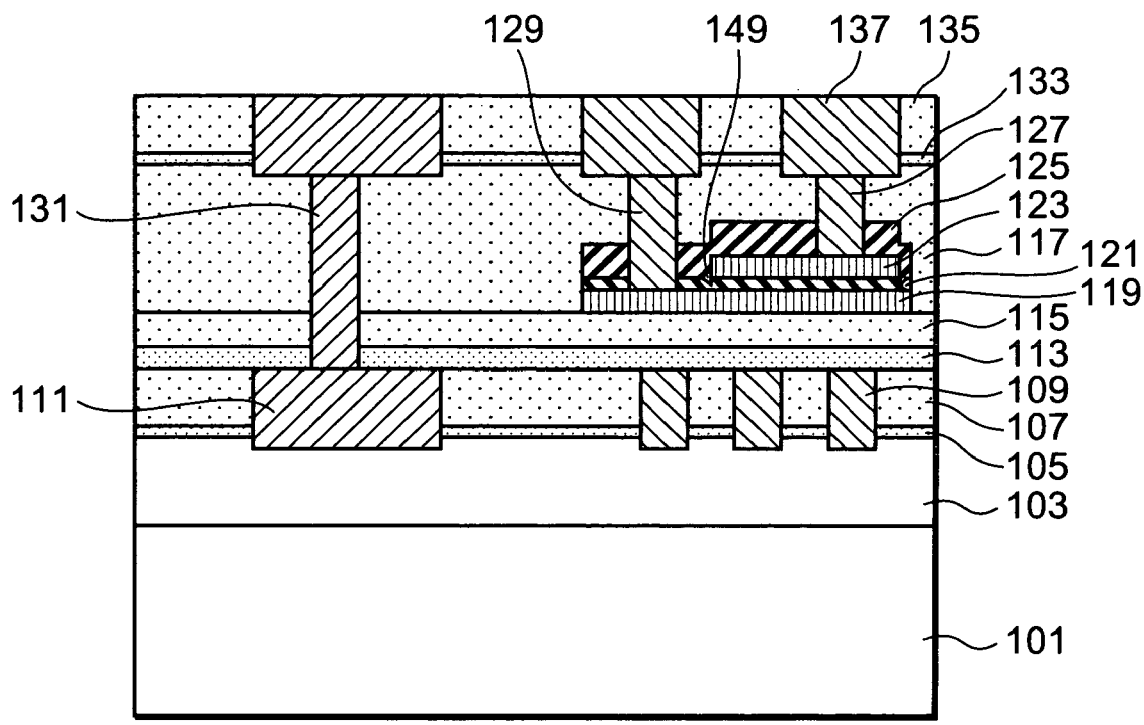
FIG. 1 is a sectional view showing a configuration of a semiconductor device in this embodiment.

FIG. 1 is a sectional view showing a exemplary configuration of a semiconductor device in this embodiment.

A semiconductor device 100 shown in FIG. 1 includes: a lower electrode 119 provided on the upper part of a semiconductor substrate (a silicon substrate 101); an upper electrode 123 that is provided on an upper part of the lower electrode 119 and that is provided so as to overlap a part of the lower electrode 119; a first insulating film (a capacitance film 121) provided between the lower electrode 119 and the upper electrode 123; and a second insulating film 125 that is provided in contact with an upper part of the upper electrode 123 and that is provided selectively on the upper part of the lower electrode 119, having a higher film density than that of the lower electrode 119.

Figure 6:
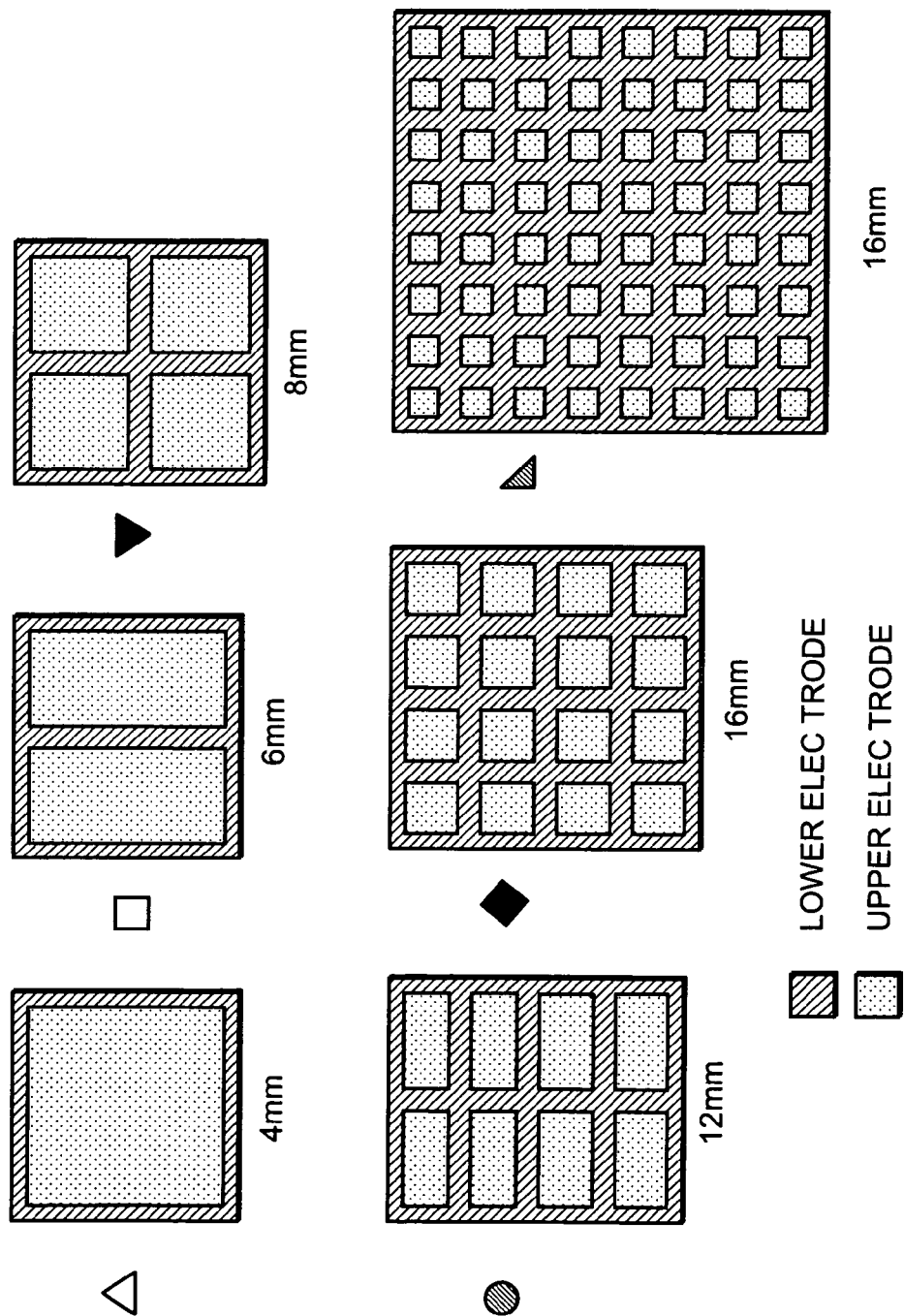
FIG. 6 is a diagram illustrating the structure of the capacitative element in the embodiment.

Moreover, FIG. 6 is a plan view showing a configuration of a formation area of the capacitative element of the semiconductor device 100 shown in FIG. 1. As shown in FIGS. 1 and 6, in the semiconductor device 100, in plan view, a grooved concavity (a groove part 149) is provided in the capacitance film 121 along an edge of the lower electrode 119, and the second insulating film 125 buries the groove part 149 and covers side surfaces and a top surface of the upper electrode 123.

The first insulating film and the second insulating film 125 that constitute the capacitance film 121 shall be, for example, films whose constituent elements are the same kinds, respectively. Specifically, each of the capacitance film 121 and the second insulating film 125 includes N and Si as constituent elements and the two films are configured so that a content of N of the second insulating film 125 is higher than a content of N of the capacitative element 121. Moreover, the two films are configured so that a dielectric constant of the second insulating film 125 is higher than the dielectric constant of the capacitance film 121.

Here, a content of N of the capacitance film 121 or the second insulating film 125 means a ratio of N to the sum total of the constituent elements (for example, Si, N) contained in the film of a unit volume and is measured, for example, by an FT-IR (Fourier transform infrared spectroscopy photometer) method.

Moreover, in the semiconductor device 100, an interlayer insulating film 103, a cap film 105, an interlayer insulating film 107, a cap film 113, an interlayer insulating film 115, an interlayer insulating film 117, a cap film 133, and an interlayer insulating film 135 are being laminated in this order on the silicon substrate 101. The lower electric wiring 109 and the lower electric wiring 111 are buried in the interlayer insulating film 107 and the cap film 105. The upper electric wiring 137 is buried in the interlayer insulating film 135 and the cap layer 133.

The interlayer insulating film 103, the interlayer insulating film 107, the interlayer insulating film 115, the interlayer insulating film 117, and the interlayer insulating film 135 are, for example, insulating films made up of low dielectric constant materials, respectively (low dielectric constant films). The relative dielectric constant of the low dielectric constant film is, for example, 3.5 or less, preferably 3 or less. The low dielectric constant film can be a film that contains Si, O, and H as constituent elements, for example. Moreover, the low dielectric constant film can be a film that contains Si, C, O, and H as constituent elements.

As a low dielectric constant film, still more specifically, there can be enumerated: SiOC film; methyl polysiloxanes such as MSQ (methylsilsesquioxane), hydrogenated methyl polysiloxanes such as MHSQ (methylated hydrogen silsesquioxane), OSG (Organo-Silicate Glass), CDO (Carbon Doped Oxide), and the other polyorganosiloxane film; HSQ (hydrogen silsequioxane), ladder oxides such as a ladder-type hydrogenated siloxane, and other hydrogenated siloxane film; parylene resins, fluororesins such as CYTOP (registered trademark), non-fluorine-based aromatic series containing resins such as SILK (registered trademark), polyarylether (PAE), polyphenylene, and other organic resin films. Moreover, films may be these films that are made porous. Production methods of these films are not limited in particular: for example, they are formed by a CVD (chemical vapor deposition) method or a coating method.

The cap film 105, the cap film 113, and the cap film 133 each function as an etching stopper film. As materials of these cap films, SiCN, SiN, etc. can be enumerated, for example.

The capacitative element constructed with the lower electrode 119, the upper electrode 123, and the insulating film provided therebetween contacts the upper part of the interlayer insulating film 115 and is buried in the interlayer insulating film 117. The lower electrode 119 and the upper electric wiring 137 are being connected by the connecting plug 129, and the upper electrode 123 and the upper electric wiring 137 are being connected by a connecting plug 127. Top surfaces of the connecting plug 127, the connecting plug 129, and a connecting plug 131 are all located on the same level, concretely being located in the interlayer insulating film 117, and these plugs are all buried in the interlayer insulating film 117.

In order to connect the upper electrode 123 and the lower electrode 119 to the upper electric wiring 137, respectively, the upper electrode 123 is formed to overlap a part of the formation area of the lower electrode 119. In the semiconductor device 100, as shown in FIG. 6, the upper electrode 123 is provided in an inside 5 of the periphery of the lower electrode 119 in plan view. Moreover, the lower electric wiring 111 and the upper part electric wiring 137 are being connected by the connecting plug 131.

Next, an exemplary production method of the semiconductor device 100 will be explained. This production method is a production method of the semiconductor device that has a capacitative element, and includes the following processes.

Step 11: Forming a first conducting film (a TiN film 139), a first insulating film (a SiN film 141), and a second conducting film (a TiN film 143) on an upper part of the silicon substrate 101 in this order;

Step 12: Forming the upper electrode 123 by selectively removing the TiN film 143;

Step 13: Forming the second insulating film 125 having a higher film density than that of the SiN film 141 that covers a top surface of the SiN film 141 and side surfaces of the upper electrode 123 over from the top surface of the SiN film 141 to the top surface of the upper electrode 123 on an element formation surface of the silicon substrate 101 on which the upper electrode 123 is formed;

Step 14: Processing the second insulating film 125 into a predetermined form by selectively removing the second insulating film 125, the SiN film 141, and the TiN film 139 sequentially; and forming the capacitance film 121 and the lower electrode 119.

Below, the process will be explained more concretely with reference to FIGS. 2A to 2K, which are sectional views showing manufacturing processes of the semiconductor device 100.

Figure 2A:
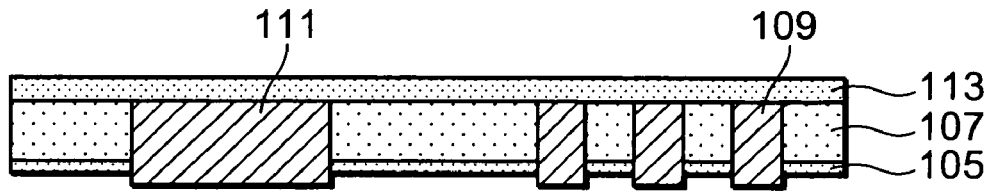
FIGS. 2A to 2K are sectional views showing the respective manufacturing process of the semiconductor device of FIG. 1.
Figure 2B:
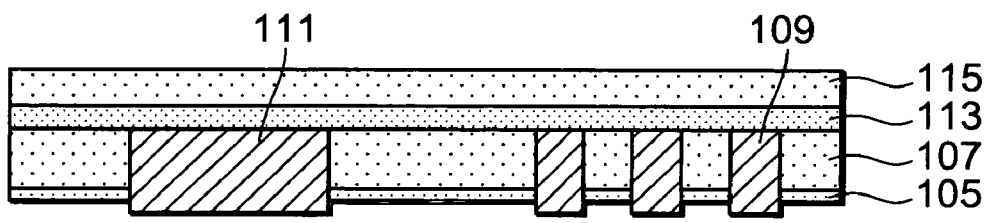
Figure 2C:
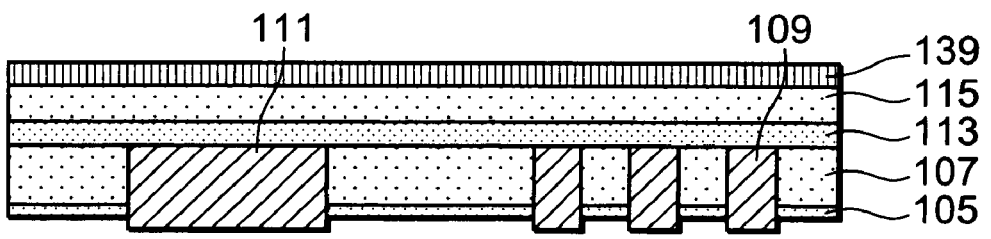
Figure 2D:
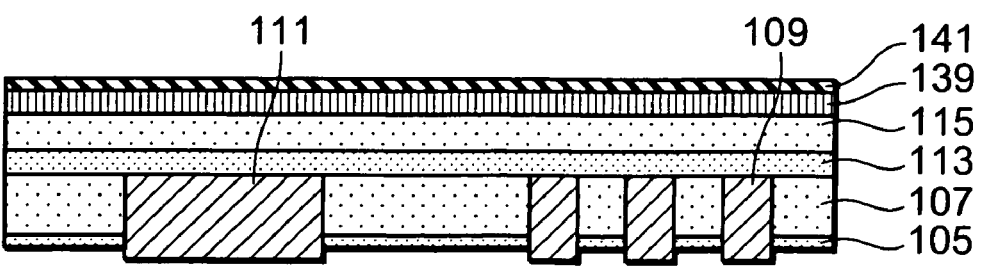
Figure 2E:
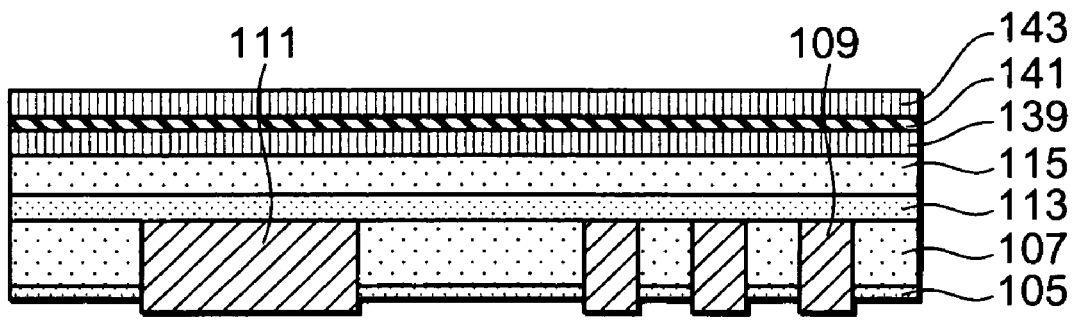
Figure 2F:
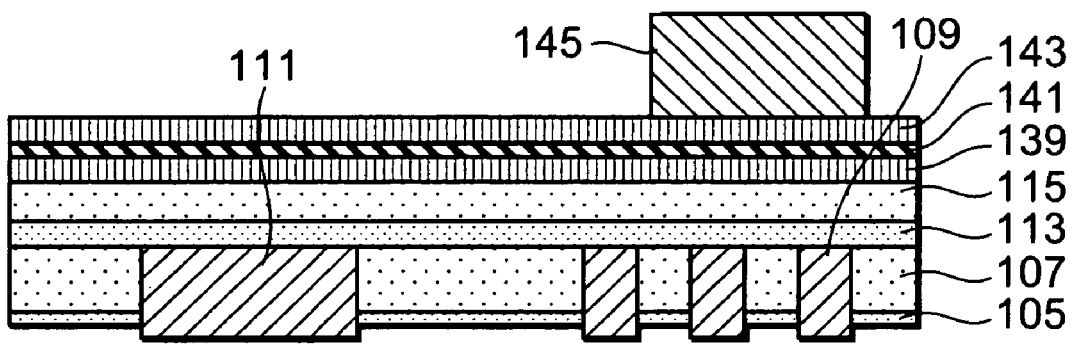

First, a predetermined element (unillustrated), such as a transistor, is formed on the silicon substrate 101 (FIG. 1). Then, as shown in FIG. 2A, the interlayer insulating film 103 (FIG. 1), the SiCN film as the cap film 105, and the SiOC film as the interlayer insulating film 107 are formed on the silicon substrate 101 in this order, and a lower electric wiring 111 and a lower electric wiring 109 are formed by a damascene process. Then, as the cap film 113 contacting the upper part of an interlayer insulating film 107, a SiCN film is formed to a thickness of about 100-200 nm.

After forming a SiCN film as the interlayer insulating film 115 on the cap film 113 (FIG. 2B), the TiN film 139 that becomes the lower electrode 119 (FIG. 2C), the SiN film 141 (FIG. 2D) that becomes a capacitance film 121, and the TiN film 143 (FIG. 2E) that becomes the upper electrode 123 are formed sequentially, on the interlayer insulating film 115. The thickness of the SiN film 141 shall be, for example, about 10-15 nm.

Figure 2G:
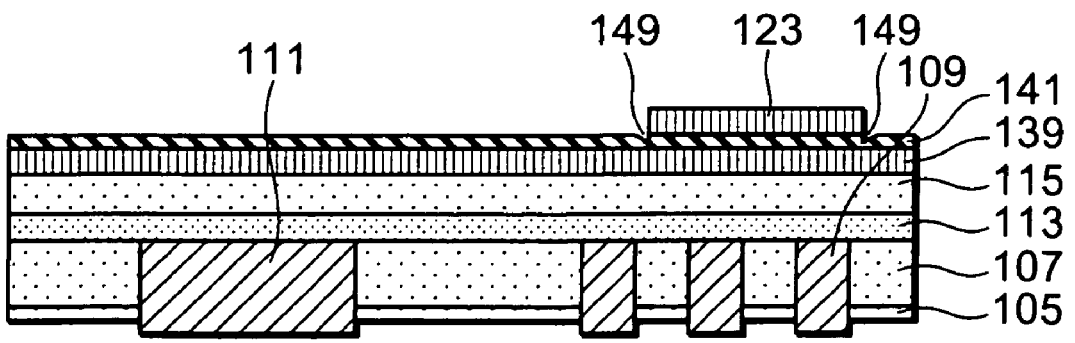

Next, a mask 145 such that an area other than a formation area of the upper electrode 123 is specified to be an opening part is formed on the TiN film 143 (FIG. 2F), and the TiN film exposing out of the mask 145 is selectively removed by etching, whereby the upper electrode 123 is formed (FIG. 2G). In doing this, by exposing the top surface of the SiN film 141 in an area where the TiN film is removed and by selectively etching the SiN film 141 in the vicinity of the edge of the TiN film 143, a groove part is formed in the SiN film 141. Thus, in the production method of this embodiment, at the time of formation of the upper electrode 123 by etching, the SiN film 141 that becomes the capacitance film 121 is not removed, but remained. Moreover, this etching forms a recess (an overetched area), namely a groove part 149 along an edge of the upper electrode 123.

Figure 2H:
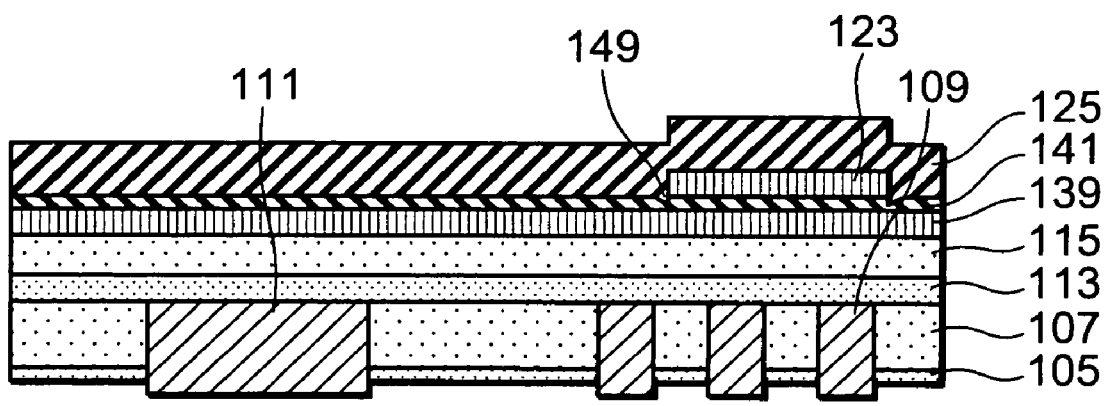
Figure 2I:
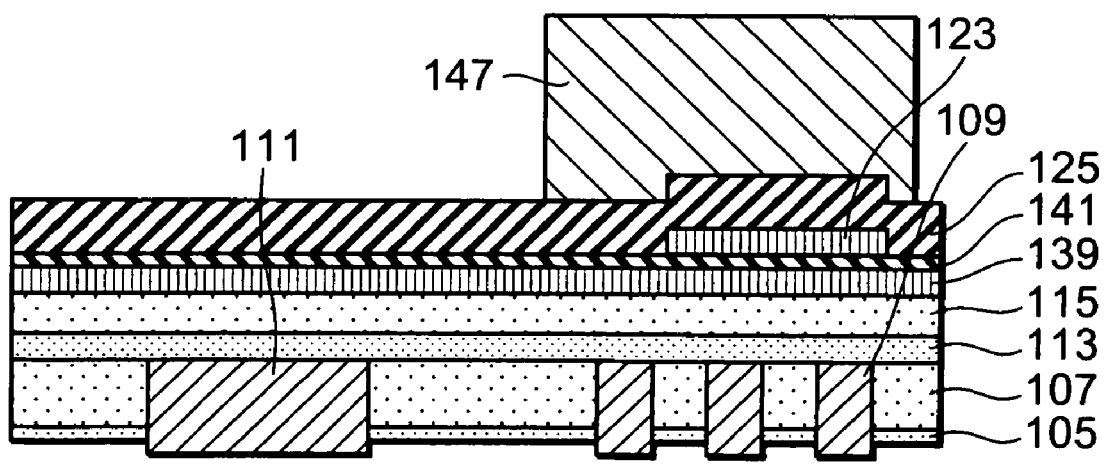

After the mask 145 is removed, the second insulating film 125 is formed all over the element formation surface of the silicon substrate 101 on which the upper electrode 123 and the groove part 149 are formed. The second insulating film 125 includes, for example, Si and N as constituent elements and is specified to have a higher N content than that of the SiN film 141 and have a higher film density than that of the SiN film 141, and the second insulating film 125 is formed, for example, by a CVD method and buries the groove part 149 (FIG. 2H). The thickness of the second insulating film 125 shall be, for example, about 100-200 nm.

Incidentally, when forming the SiN film whose film density is higher than that of the capacitance film 121 as the second insulating film 125, conditions of the capacitance film 121 and the second insulating film 125 in the CVD method are set as follows, for example. That is, for the capacitance film 121, a flow rate of a gas containing Si, such as silane, and a gas containing N, such as ammonia, are set comparable and a plasma power is weakened relatively. By this setting, even when the film thickness of the capacitance film 121 is small, film thickness controllability can be improved. On the other hand, for the second insulating film 125, the flow rate of the gas containing N to the flow rate of the gas containing Si is made large, and the plasma power is set high compared to that at the time of formation of the capacitance film 121. By this setting, the second insulating film 125 that has a higher N content, a higher film density, and a higher dielectric constant than those of the capacitance film 121 can be formed stably.

Figure 2J:
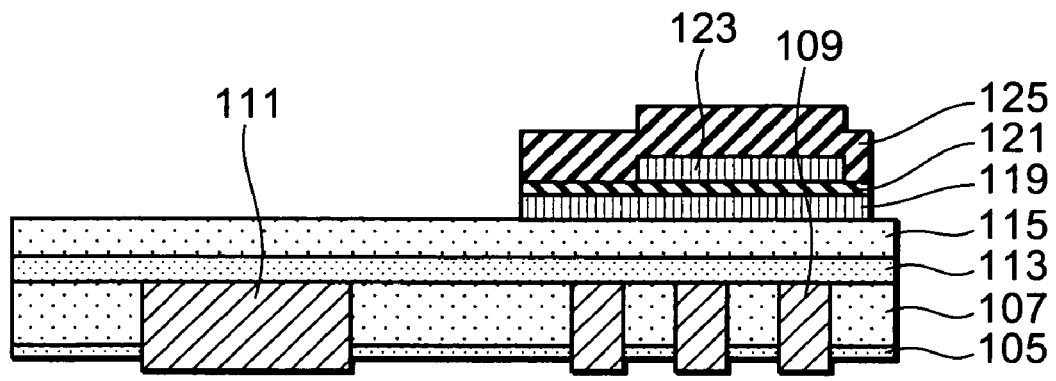

After that, a mask 147 that covers a formation area of the capacitance film 121 and the lower electrode 119 is formed on the second insulating film 125 (FIG. 2I), and the second insulating film 125, the SiN film, and the TiN film 139 that expose out of the mask 147 are selectively removed sequentially, whereby both the capacitance film 121 and the lower electrode 119 are selectively formed below a formation area of the second insulating film 125 (FIG. 2J). By this process, the capacitance film 121 and the lower electrode 119 become substantially the same flat shape as the second insulating film 125.

Figure 2K:
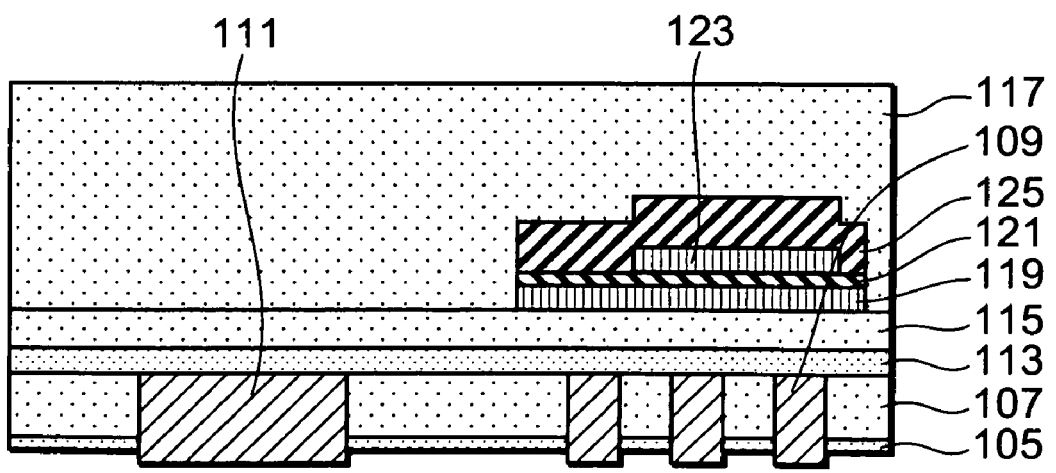

After the mask 147 is removed, a SiOC film is formed as an interlayer insulating film 117 all over the element formation surface of the silicon substrate 101 on which the second insulating film 125 was processed, and the capacitative element is buried in the interlayer insulating film 117 (FIG. 2K). Then, the cap film 133 and the interlayer insulating film 135 are formed sequentially on the interlayer insulating film 117, and using a damascene process, such as a dual damascene method, the connecting plug 131 connecting with the lower electric wiring 111, the connecting plug 129 connecting with the lower electrode 119, the connecting plug 127 connecting with the upper electrode 123, and the upper wiring 137 connecting with these connecting plugs are formed. By the above procedure, the semiconductor device 100 shown in FIG. 1 is obtained.

Next, an action effect of this embodiment will be explained.

In this embodiment, since the upper electrode 123 is provided being overlapping a part of the lower electrode 119, at the time of processing of the upper electrode 123, the capacitance film 121 is selectively etched along the edge (peripheral line) of the upper electrode 123, so that a groove part 149 is formed. Since a formation area of the groove part 149 is an area where an electric field tends to concentrate, if the capacitance film 121 is damaged in such a location, breakdown is easy to occur, which leads to the decrease in a withstand voltage. In contrast to this, with this embodiment, by burying the second insulating film 125 whose film density is higher than that of the capacitance film 121 in the groove part 149, the breakdown can be suppressed effectively and the withstand voltage can be improved. This action effect is more notably demonstrated when the dielectric constant of the second insulating film 125 is higher than the dielectric constant of the capacitance film 121. Moreover, like the semiconductor device 100 shown in FIG. 1, if the upper electrode 123 is formed in the inside of the formation area of the lower electrode 119 in plan view, it will be much more effective.

Figure 3:
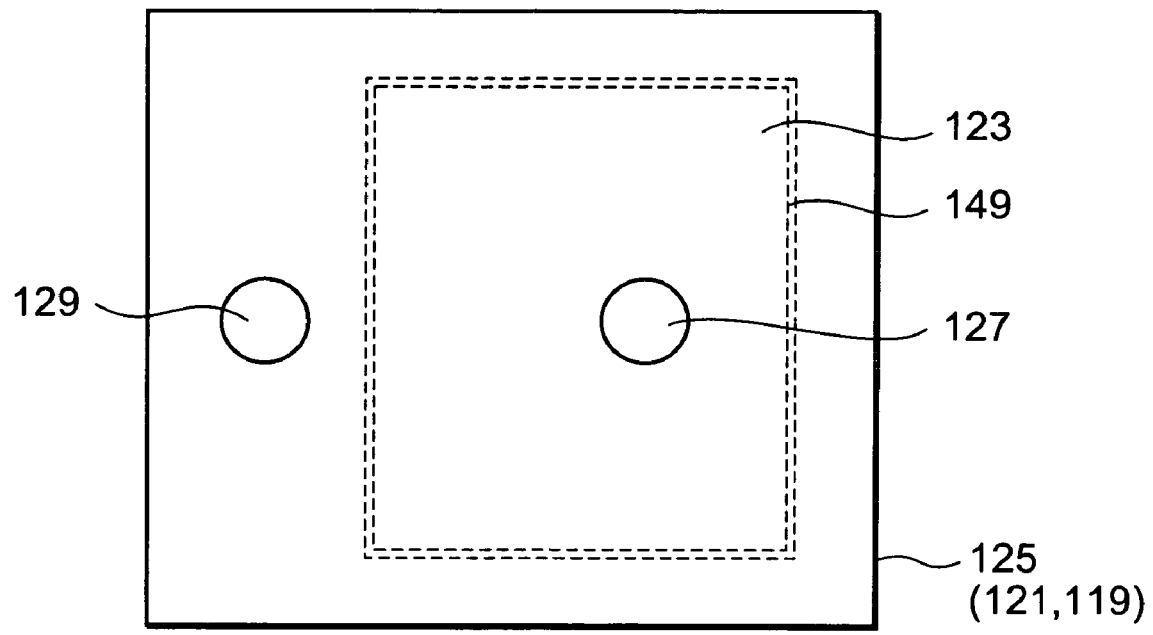
FIG. 3 is a plan view showing a structure of a formation area of a capacitative element of the semiconductor device in this embodiment.

Moreover, in this embodiment, as shown in FIG. 3, in plan view, both the capacitance film 121 and the second insulating film 125 are selectively provided on the upper part of the lower electrode 119. For this reason, an MIM capacity can be protected from a stress that is given in assembling the device. Moreover, since by selectively providing a film whose film density is high, namely a film whose dielectric constant is high, on the upper part of the lower electrode 119, the dielectric constants of the interlayer insulating film on other parts can be suppressed, the capacity between the electric wiring can be suppressed. Moreover, even in the case where the interlayer insulating film 117 is a low dielectric constant film, adhesion of the capacitative element and the interlayer insulating film 117 in the formation area of the lower electrode 119 can be improved. Furthermore, even in the case where the interlayer insulating film 117 is formed by a low dielectric constant film that absorbs moisture comparatively easily, moisture resistance of the capacitative element can be improved by providing the second insulating film 125 in the whole formation area of the lower electrode 119. Therefore, compared to a configuration where the second insulating film 125 is selectively provided only in the vicinity of the formation area of the upper electrode 123, production stability and reliability of the semiconductor device 100 can be still further improved. This action effect is notably demonstrated when the second insulating film 125 is given a configuration where it covers the whole surface of a formation area of the lower electrode 119 and a formation area of the upper electrode 123.

Moreover, in order to secure conduction between the lower electrode 119 of the capacitative element of a parallel plate form and an upper electric wiring 137 in the semiconductor device 100, a connecting plug 129 that comes in contact with a top surface of the lower electrode 119 and the under surface of the upper electrode 137 is provided in a non-formation area of the upper electrode 123 on the upper part of the lower electrode 119. In this configuration, by configuring it in such a way that the capacitance film 121 and the second insulating film 125 are formed on the lower electrode 119, a connecting plug 129 is made to penetrate the capacitance film 121 and the second insulating film 125, and the second insulating film 125 is provided in contact with the side surface of the connecting plug 129, with miniaturization of the element, even when the edge of the upper electrode 123 and the connecting plug 129 are arranged being brought closer to each other, an area between the connecting plug 129 and the upper electrode 123 can be reinforced; therefore, it becomes possible to effectively suppress the breakdown in the area between the side surface of the connecting plug 129 and the upper electrode 123. Moreover, also in the case where the interlayer insulating film 117 is a low dielectric constant film, the connecting plug can be stably formed at a desired position and the adhesion of the connecting plug 129 and the insulating film provided in contact with its side surface can be improved.

Moreover, in this embodiment, the interlayer insulating film 117 is a low dielectric constant film, and the dielectric constant of the second insulating film 125 is higher than the dielectric constants of the interlayer insulating film 115 and the interlayer insulating film 117. In addition, the semiconductor device 100 is provided on the upper part of the silicon substrate 101 and contains a stopper film (the cap film 113) provided in contact with an under surface of the interlayer insulating film 115. The etching rate of the second insulating film 125 is smaller than the etching rates of the interlayer insulating film 115 and the interlayer insulating film 117 and is more than or equal to the etching rate of the cap film 113.

Since the etching rate of the second insulating film 125 is smaller than the etching rate of the interlayer insulating film 117, when forming simultaneously the connecting plug 129 and the connecting plug 127 that are different in a bottom position, the second insulating film 125 functions as an etching stopper film, so that overetching of the upper electrode 123 at the time of formation of a connection hole can be suppressed. Furthermore, by setting the etching rate of the second insulating film 125 larger than or equal to the etching rate of the cap film 113, even the connecting plug is formed in addition to the connecting plug 127 and the connecting plug 129 in the same process, manufacturing stability of the respective plugs can be improved by suppressing overetching of the lower electrode 119 and the upper electrode 123 at the time of formation of the connection hole. Moreover, regarding the connection hole in which the connecting plug 131 will be buried, after terminating the etching at the top surface using the cap film 113 as a stopper film, by removing a resist film (unillustrated) provided as a mask and by etching back the cap film 113, the connection hole that connects with the lower electric wiring 111 can be stably formed.

In the foregoing, exemplary embodiments of the present invention were described with reference to the drawings. However, these are exemplifications of the present invention, and various configurations other than what was described above can also be adopted.

For example, in the above embodiment, although the case where the capacitance film 121 and the second insulating film 125 were the SiN films was explained by way of example, materials of these films are not restricted to the SiN film. As a material of the capacitance film 121, besides, a SiCN film, a SiC film, a SiN film, a SiO₂ film, a silicon carbide nitride film, a polyimide film, etc. can be enumerated, and a single layer of one of them and a lamination film of two or more layers can be used. Moreover, the capacitance film 121 may be a high dielectric constant film. The high dielectric constant film is a film whose relative dielectric constant is higher than that of silicon oxide, and for it, a so-called high-k film can be used. The high dielectric constant film can be made up of a material of a relative dielectric constant of 6 or more. Concretely, the high dielectric constant film can be made up of a material including one or more than one metal elements selected from a group consisting of Hf, Ta, Zr, Ti, W, Re, Tb, and Al, respectively, and can be specified to be a film, an alloy film, an oxide film, a silicate film, a carbide film, etc. each containing any one of these metal elements. These films may be used independently, and a plurality of films may be combined to a lamination film.

Moreover, the second insulating film 125 should just be a material whose film density is higher than that of the capacitance film 121, and can be selected, for example, from among materials exemplified above as a material of the capacitance film 121 according to the material of the capacitance film 121.

As concrete examples of combinations of the capacitance film 121 and the second insulating film 125, in addition to the above, there can be enumerated;

a combination in which the capacitance film 121 is specified as a SiN film and the second insulating film 125 is specified as a tantalum oxide film whose film density is higher than that of the capacitance film 121;

a combination in which both the capacitance film 121 and the second insulating film 125 are specified as a tantalum oxide film, and a content of O of the second insulating film 125 is set smaller than a content of O of the capacitance film 121;

a combination in which both the capacitance film 121 and the second insulating film 125 are specified as a zirconium oxide film, and a content of O of the second insulating film 125 is set smaller than a content of O of the capacitance film 121;

a combination in which the capacitance film 121 is specified as a SiON film and the second insulating film 125 is specified as a SiN film;

a combination in which the capacitance film 121 is specified as a lamination film of tantalum oxide/SiN and the second insulating film 125 is specified as a SiN film whose film density is higher than that of the capacitance film 121; etc.

Embodiment

In this embodiment, a semiconductor device of a structure corresponding to the semiconductor device 100 shown in FIG. 1 was produced, and its TDDB (Time Dependent Dielectric Breakdown) is evaluated as an index of the withstand voltage of a capacitance film.

Here, the total area of the upper electrode was set to 1 mm², and as shown in FIG. 6, six kinds of measurement patterns different in a perimeter length of the upper electrode were evaluated. FIG. 6 is a diagram showing plane shapes of the upper electrode and the lower electrode of the capacitative element manufactured in this embodiment. In FIG. 6, each number written under the each pattern is a total length (mm) of the perimeter length of the upper electrode. For example, since in a pattern shown by void triangles (Δ) in FIG. 6, the upper electrode is specified as a square with a side of 1 mm length, the sum total of the perimeter length of the upper electrode is 4 mm.

Moreover, the MIM insulating film (capacitance film) was specified as a SiN film of a thickness of 15 nm, and film formation condition are set as follows:

RF power: 840 W
SiH₄ flow: 260 sccm
NH₃ flow: 140 sccm
N₂: 18000 sccm

The film density of the obtained film measured by an XRR (X-ray Reflectivity) method was 3.1 g/cm³, and the content of N measured by an RBS (Rutherford Backscattering Spectroscopy) method was 30%.

The insulating film on the electrode (the second insulating film) was specified as a SiN film of a thickness of 100 nm, and its film deposition conditions were set as follows:

RF power: 1000 W
SiH₄ flow: 260 sccm
NH₃ flow: 280 sccm
N₂: 18000 sccm

The film density of the obtained film measured by the XRR method was 3.7 g/cm³, and the content of N measured by the RBS method was 40%.

Figure 7:
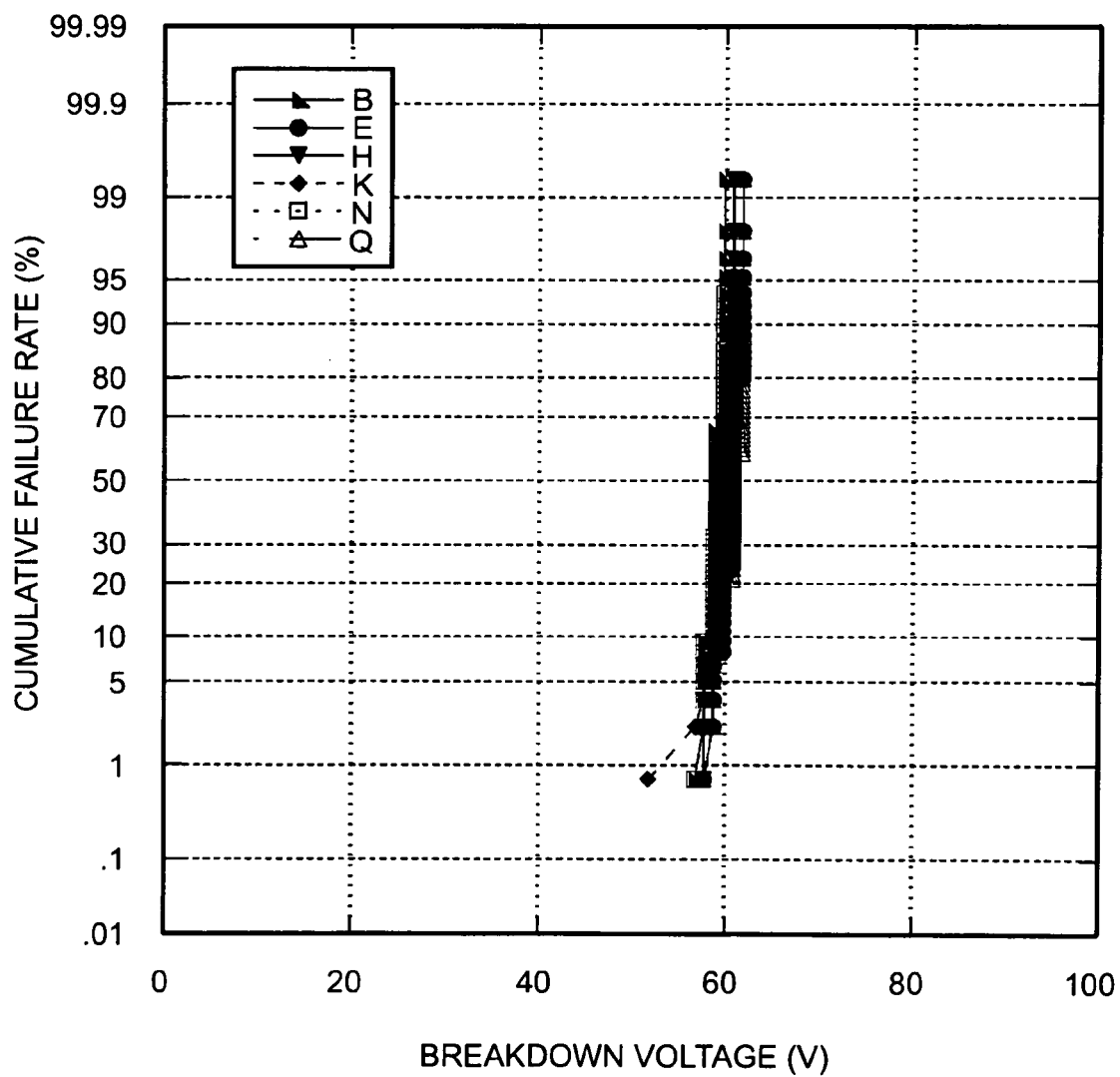
FIG. 7 is a diagram showing an evaluation result of a withstand voltage of the capacitative element in the embodiment.

The evaluation result is shown in FIG. 7. Incidentally in FIG. 7 and the later-described FIG. 8, the horizontal axis represents a breakdown voltage (V) and the vertical axis represents a cumulative failure rate (%).

Comparative Example

Figure 4:
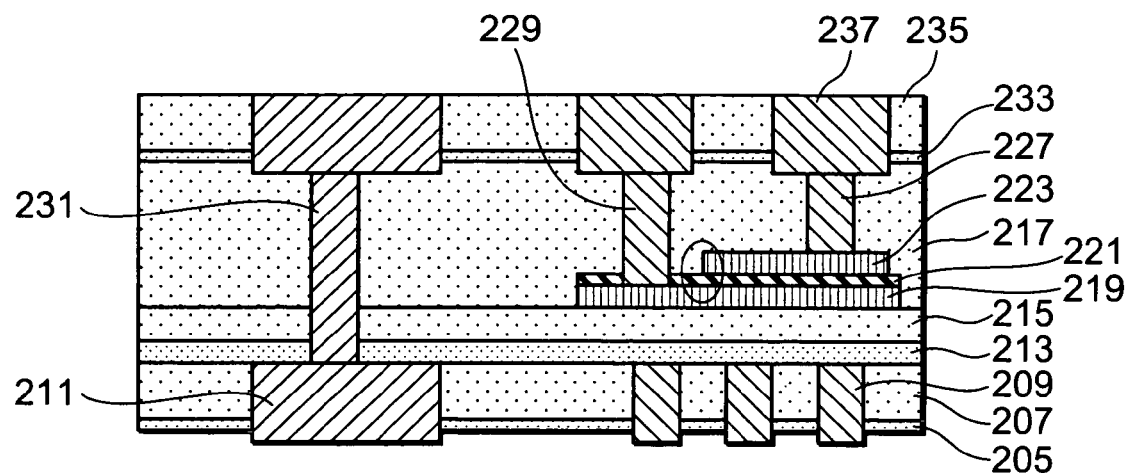
FIG. 4 is a sectional view showing the configuration of the semiconductor device.
Figure 5:
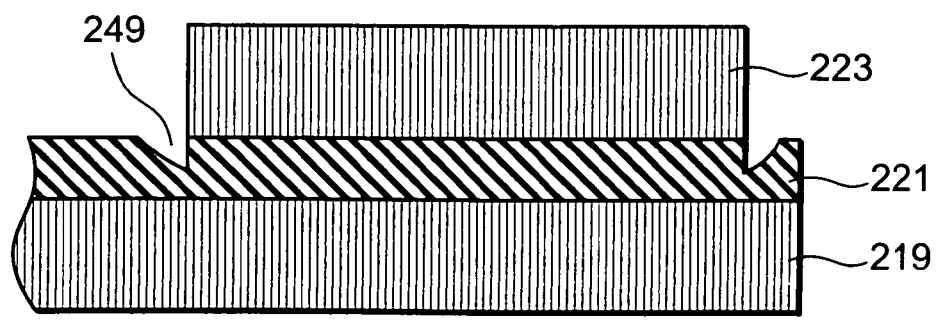
FIG. 5 is a plan view showing a structure of a capacitative element of the semiconductor device of FIG. 4.

In this comparative example, instead of the semiconductor device 100 shown in FIG. 1, a semiconductor device of a structure corresponding to that of the semiconductor device shown in FIG. 4 is produced, and the TDDB of the capacitance film was evaluated in the same manner as the embodiment. Its evaluation result is shown in FIG. 8.

From FIGS. 7 and 8, since in a comparative example shown in FIG. 8, the upper electrode does not have the second insulating film, the longer the perimeter length of the upper electrode, an initial malfunction withstand voltage becomes lowered.

On the other hand, in the embodiment shown in FIG. 7, by providing the second insulating film on the upper electrode, it is known that leakage in the surrounding of the upper electrode is effectively suppressed, and the initial malfunction withstand voltage and the breakdown voltage are improved notably.

Further, it is noted that, Applicant's intent is to encompass equivalents of all claim elements, even if amended later during prosecution.

What is claimed is:

1. A semiconductor device, comprising:
   a lower electrode provided on a semiconductor substrate;
   an upper electrode provided on the lower electrode to overlap a part of the lower electrode;
   a first insulating film provided between the lower electrode and the upper electrode; and
   a second insulating film provided in contact with an upper part of the upper electrode and on an upper part of the lower electrode, and having a density greater than a density of the first insulating film, the second insulating film covering a side surface and a top surface of the upper electrode.

2. The semiconductor device according to claim 1, wherein, in plan view, a groove is provided in the first insulating film along an edge of the upper electrode, and the second insulating film fills the groove.

3. The semiconductor device according to claim 1, wherein the second insulating film and the first insulating film are selectively provided on the upper part of the lower electrode.

4. The semiconductor device according to claim 2, further comprising:
   a low dielectric constant interlayer insulating film provided on the second insulating film; and
   a connecting plug that penetrates the first and second insulating films in a non-formation area of the upper electrode and connects with a top surface of the lower electrode,
   wherein the lower electrode, the first insulating film, the upper electrode, the second insulating film, and the connecting plug are all covered by the low dielectric constant interlayer insulating film, and
   wherein the second insulating film is provided between the connecting plug and the upper electrode, and is provided in contact with a side surface of the connecting plug.

5. The semiconductor device according to claim 4, further comprising:
   a stopper film provided on the semiconductor substrate and in contact with an under surface of the low dielectric constant interlayer insulating film,
   wherein an etching rate of the second insulating film is less than an etching rate of the low dielectric constant interlayer insulating film and is greater than or equal to an etching rate of the stopper film.

6. The semiconductor device according to claim 1, wherein a dielectric constant of the second insulating film is greater than a dielectric constant of the first insulating film.

7. The semiconductor device according to claim 6, wherein constituent elements of the first insulating film are the same as constituent elements of the second insulating film.

8. The semiconductor device according to claim 7, wherein each of the first insulating film and the second insulating film contains N and Si as the constituent elements and a content percentage of N of the second insulating film is greater than a content percentage of N of the first insulating film.

9. A semiconductor device, comprising:
   a lower electrode formed on a semiconductor substrate;
   a dielectric film formed on said lower electrode;
   an upper electrode formed on a portion of said dielectric film such that said lower electrode and said dielectric film have a non-overlapped portion with said upper electrode;
   an insulating film which covers the non-overlapped portion of said dielectric film and upper and side surfaces of said upper electrode, and includes an element same as an element included in said dielectric film, a volume of said element of said insulating film being greater than a volume of said element of said dielectric film, and a density of said insulating film being greater than a density of the dielectric film.

10. The device as claimed in claim 9, wherein said upper electrode is provided inside a periphery of said lower electrode in a plan view.

11. The device as claimed in claim 10, wherein a groove is formed in the dielectric film along an edge of the upper electrode, and the insulating film fills the groove.

12. The device as claimed in claim 10, wherein the dielectric film is devoid of a groove along an edge of the upper electrode.

13. The semiconductor device according to claim 1, wherein the first insulating film comprises an SiN film, and the second insulating film comprises an SiN film having a film density which is greater than a film density of the first insulating film.

14. The semiconductor device according to claim 1, wherein, in a plan view, a groove is provided in the first insulating film along an edge of the upper electrode and directly adjacent to the edge of the upper electrode, and the second insulating film fills the groove.

* * * * *